United States Patent
Kim et al.

(10) Patent No.: US 7,381,989 B2
(45) Date of Patent: Jun. 3, 2008

(54) SEMICONDUCTOR DEVICE INCLUDING UPPER AND LOWER TRANSISTORS AND INTERCONNECTION BETWEEN UPPER AND LOWER TRANSISTORS

(75) Inventors: Hyun-Su Kim, Suwon-si (KR); Gil-Heyun Choi, Yongin-si (KR); Jong-Ho Yun, Suwon-si (KR); Sug-Woo Jung, Suwon-si (KR); Eun-Ji Jung, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/368,418

(22) Filed: Mar. 7, 2006

(65) Prior Publication Data

US 2006/0197117 A1    Sep. 7, 2006

(30) Foreign Application Priority Data

Mar. 7, 2005    (KR) ............... 10-2005-0018781

(51) Int. Cl.
H01L 29/76    (2006.01)
H01L 31/036   (2006.01)
H01L 31/112   (2006.01)

(52) U.S. Cl. .............. 257/67; 257/365; 257/E27.064
(58) Field of Classification Search ............. 257/67, 257/347, 365, 366, 903, 906, E27.064
See application file for complete search history.

(56) References Cited

U.S. PATENT DOCUMENTS 6,232,637 B1 * 5/2001 Gardner et al. ............. 257/368
6,765,272 B2 * 7/2004 Natsume ..................... 257/393
6,828,611 B2 * 12/2004 Kim et al. ................... 257/296

FOREIGN PATENT DOCUMENTS

| JP | 08-018016 | 1/1996 |
|---|---|---|
| JP | 08-018039 | 1/1996 |
| JP | 09-129754 | 5/1997 |
| JP | 2000-082738 | 3/2000 |
| JP | 2002184993 A | 6/2002 |
| KR | 1020000066847 A | 11/2000 |
| KR | 1020030021375 A | 3/2003 |

* cited by examiner

*Primary Examiner*—Hoai v Pham
(74) *Attorney, Agent, or Firm*—Volentine & Whitt, PLLC (57) ABSTRACT

A stacked semiconductor device comprises a lower transistor formed on a semiconductor substrate, a lower interlevel insulation film formed on the semiconductor substrate over the lower transistor, an upper transistor formed on the lower interlayer insulation film over the lower transistor, and an upper interlevel insulation film formed on the lower interlevel insulation film over the upper transistor. The stacked semiconductor device further comprises a contact plug connected between a drain or source region of the lower transistor and a source or drain region of the upper transistor, and an extension layer connected to a lateral face of the source or drain region of the upper transistor to enlarge an area of contact between the source or drain region of the upper transistor and a side of the contact plug.

23 Claims, 5 Drawing Sheets

Fig. 1

(PRIOR ART)

SEMICONDUCTOR DEVICE INCLUDING UPPER AND LOWER TRANSISTORS AND INTERCONNECTION BETWEEN UPPER AND LOWER TRANSISTORS

BACKGROUND OF THE INVENTION

1. Field of the Invention

The present invention relates generally to a semiconductor device and a method of fabricating the same. More particularly, the invention relates to a stacked semiconductor device and a method of fabricating the same.

A claim of priority is made to Korean Patent Application 2005-18781, filed on Mar. 7, 2005, the disclosure of which is hereby incorporated by reference in its entirety.

2. Description of Related Art

Semiconductor apparatuses commonly employ metal-oxide semiconductor (MOS) transistors as switching devices. To provide the highest possible performance, the MOS transistors are generally formed in dense arrays. A somewhat recent innovation used to increase the density of these arrays and also to decrease the leakage current of the transistors is to stack the transistors on top of each other, i.e., to form "stacked transistors."

Figure 1:
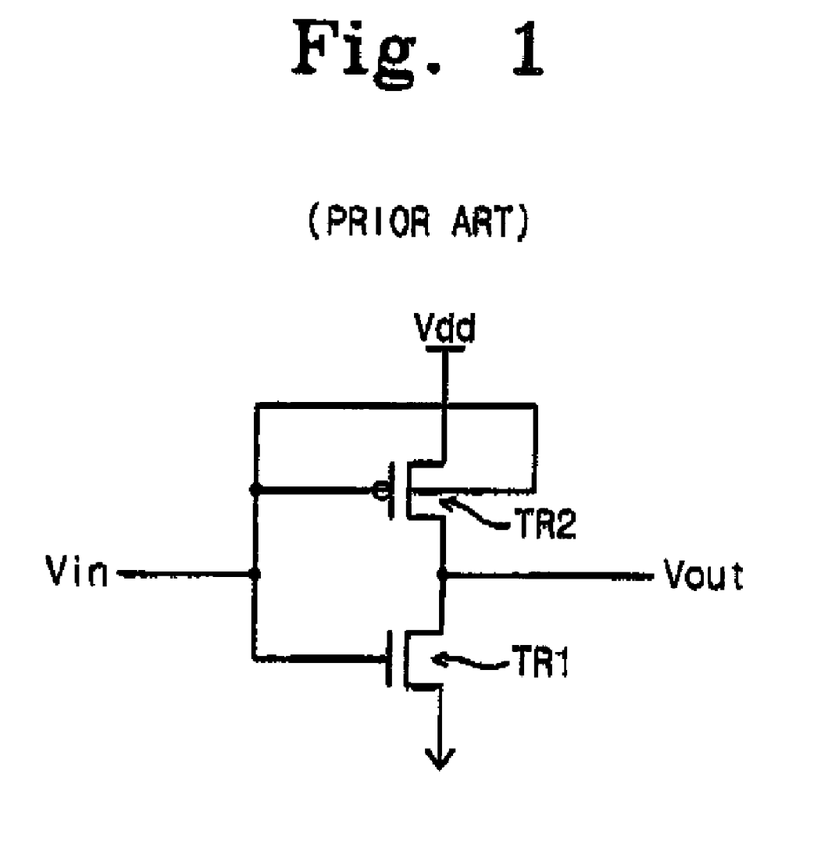
FIG. 1 is a circuit diagram of a conventional inverter.

For example, FIG. 1 is a circuit diagram of a conventional inverter which may be formed by stacking one transistor on top of another.

Referring to FIG. 1, the inverter comprises first and second transistors TR1 and TR2, both having gate electrodes connected to an input line Vin. First transistor TR1 has a drain connected to an output line Vout and a source connected to ground and second transistor TR2 has a drain connected to a power source providing a power source voltage Vdd and a source connected to output line Vout. As shown in FIG. 1, first transistor TR1 is an NMOS transistor and second transistor TR2 is a PMOS transistor.

Such an inverter device may be constructed by forming the first and second transistors on the same substrate plane. However, stacking the transistors is will increase the density of the transistors.

One common method for forming stacked transistors comprises forming a first transistor on a semiconductor substrate, then forming an interlevel insulation film covering the first transistor, and then forming a second transistor on the interlevel insulation film. The second transistor is formed by creating a body pattern on the interlevel insulation film so that source and drain regions can be formed in the body pattern and then forming a gate electrode on the body pattern.

The above method can be used to fabricate the conventional inverter shown in FIG. 1 by stacking second transistor TR2 on first transistor TR1. However, in order to complete the inverter, a contact must be formed in the interlevel insulation film to connect the drain first transistor TR1 with the source of second transistor TR2. However, because the body pattern is typically very thin, it is difficult to form a good contact connecting first and second transistors TR1 and TR2. For instance, if silicide is used to connect the body pattern to a contact plug, electrical resistance between the body pattern and the silicide may be very high if the connection is not very good. As a result, the connection between the upper and lower transistors may be unstable.

SUMMARY OF THE INVENTION

According to an embodiment of the present invention, a semiconductor device comprises a lower transistor formed on a semiconductor substrate, a lower interlevel insulation film formed on the semiconductor substrate over the lower transistor, an upper transistor formed on the lower interlayer insulation film over the lower transistor, and an upper interlevel insulation film formed on the lower interlevel insulation film over the upper transistor. The semiconductor device further comprises a contact plug connected between a drain or source region of the lower transistor and a source or drain region of the upper transistor, and an extension layer connected to a lateral face of the source or drain region of the upper transistor to enlarge an area of contact between the source or drain region of the upper transistor and a side of the contact plug.

According to another embodiment of the present invention, a method of fabricating a semiconductor device comprises forming a lower transistor on a semiconductor substrate, forming a lower interlevel insulation film on the semiconductor substrate over the lower transistor, forming an upper transistor on the lower interlevel insulation film over the lower transistor, and forming an upper interlevel insulation film on the lower interlevel insulation film over the upper transistor. The method further comprises forming a first contact plug connected to a source or drain region of the upper transistor and penetrating the upper interlevel insulation film, and forming a second contact plug connected to a drain or source of the lower transistor and penetrating the upper and lower interlevel insulation films and electrically connected to the first contact plug.

According to still another embodiment of the invention, a method of fabricating a semiconductor device comprises forming a lower transistor on a semiconductor substrate, forming a lower interlevel insulation film on the semiconductor substrate over the lower transistor, forming an upper transistor on the lower interlevel insulation film and over the lower transistor, and forming an upper interlevel insulation film on the lower interlevel insulation film and over the upper transistor. The method further comprises forming an interconnection contact hole penetrating the upper interlevel insulation film, a source or drain region of the upper transistor, and the lower interlevel insulation film, and partially exposing a drain or source region of the lower transistor, forming spacers on sidewalls of the interconnection contact hole converting the spacers into silicide layers, and forming an interconnection contact plug in the interconnection contact hole.

BRIEF DESCRIPTION OF THE DRAWINGS

The invention is described below in relation to several embodiments illustrated in the accompanying drawings. Throughout the drawings like reference numbers indicate like exemplary elements, components, or steps, and the dimensions of layers and elements is exaggerated for clarity of illustration. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

In this written description, the terms "on", "onto", "over", "below", and so forth are used to describe relative positions of layers and elements. For example, a layer described as "on" or "onto" another layer may be directly on top of the other layer, or intervening layers may also be present.

FIGS. 2A through 2E are cross-sectional diagrams illustrating a method of fabricating a stacked semiconductor device in accordance with an embodiment of the invention.

Figure 2A:
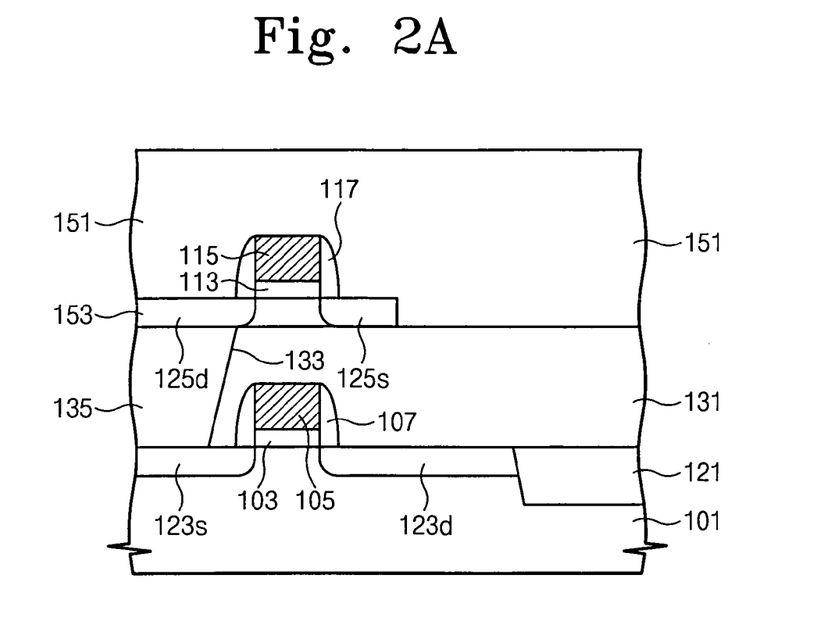
FIGS. 2A through 2E are cross-sectional diagrams illustrating a method of fabricating a stacked semiconductor device in accordance with an embodiment of the present invention.

Referring to FIG. 2A, field isolation films 121 are formed in a semiconductor substrate 101 to define active regions of the semiconductor device. Semiconductor substrate 101 typically comprises a single crystalline semiconductor substrate, such as a single crystalline silicon substrate. A lower gate insulation film 103 is formed on semiconductor substrate 101 and a lower gate electrode 105 is formed on lower gate insulation film 103. Lower gate electrode 105 is typically formed of a conductive material such as doped polysilicon or metal silicide. Lower spacers 107 are formed on sidewalls of lower gate electrode 105. Respective lower source and lower drain regions 123s and 123d are formed an active region of semiconductor substrate 101 and a part of the active region between lower source and drain regions 123s and 123d acts as a channel region for a lower transistor. Together, lower source and drain regions 123s and 123d, and lower gate electrode 105 constitute the lower transistor.

A lower interlevel insulation film 131 is formed over the lower transistor and semiconductor substrate 101. Preferably, lower interlevel insulation film 131 comprises a flattened insulation material. A body pattern 153 is formed on lower interlevel insulation film 131 above the lower transistor. Body pattern 153 is formed over lower gate electrode 105 and it extends over lower source region 123s and lower drain region 123d, either fully or in part.

Prior to forming body pattern 153, an epitaxial contact hole 133 partially exposing the active region of semiconductor substrate 101 is formed in lower interlevel film 131. A silicon epitaxial layer 135 is grown from semiconductor substrate 101 to fill up epitaxial contact hole 133. Preferably, silicon epitaxial layer 135 has the same crystalline structure as semiconductor substrate 101. For instance, where semiconductor substrate 101 comprises a single crystalline silicon substrate, silicon epitaxial layer 135 preferably has the same structure as the single crystalline substrate.

Body pattern 153 is typically formed by first depositing an amorphous silicon layer on lower interlevel insulation film 131 and then performing a thermal process on the amorphous silicon layer to convert the amorphous silicon layer into the same crystalline structure as silicon epitaxial layer 135. Alternatively, body pattern 153 may be formed by depositing a single crystalline silicon layer or a poly crystalline silicon layer on lower interlevel insulation film 131 and then performing a patterning process on the single crystalline silicon layer or the poly crystalline silicon layer.

An upper source region 125s and an upper drain region 125d are formed in body pattern 153 and a portion of body pattern 153 between upper source and drain regions 125s and 125d acts as an upper channel region of an upper transistor. The positions of upper source and drain regions 125s and 125d may be exchanged with each other about the channel region. An upper gate insulation film 113 is formed on body pattern 153 over the channel region and an upper gate electrode 115 is formed on upper gate insulation film 113. Upper spacers 117 are formed on sidewalls of upper gate electrode 115. Collectively, upper gate electrode 115, upper source region 125s, and upper drain region 125d constitute the upper transistor.

Once the upper transistor is formed, an upper interlevel insulation film 151 is deposited on lower interlevel insulating film over the upper transistor. Preferably, upper interlevel insulation film 151 is formed of a flattened insulation material, such as that used to form lower interlevel insulation film 131.

Figure 2B:
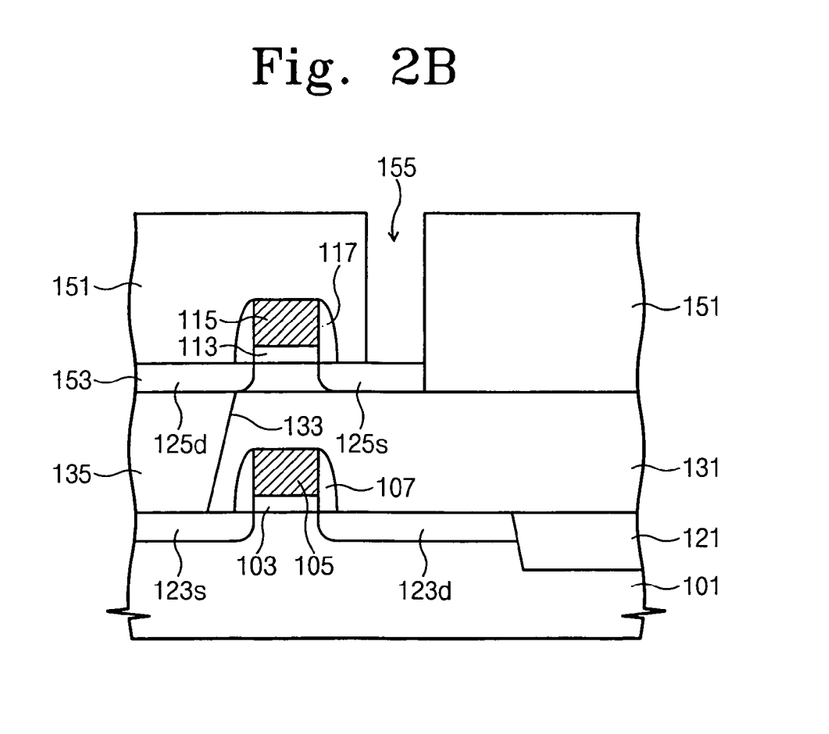

Referring to FIG. 2B, upper interlevel insulation film 151 is patterned to form a preliminary contact hole 155 exposing upper source or drain region 125s or 125d. Although FIG. 2B shows a bottom surface of preliminary contact hole 155 formed on a top surface of body pattern 153, the bottom surface could also be formed in body pattern 153 or on lower interlevel insulation film 131. In addition, a plurality of preliminary contact holes 155 could also be formed instead of just one. Preliminary contact hole 155 may have upper and lower widths that are different from each other.

Figure 2C:
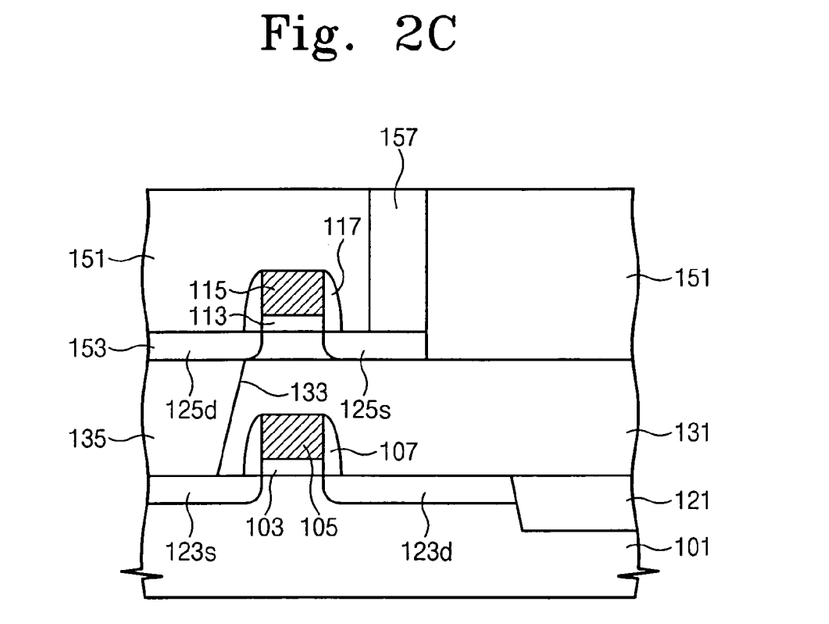

Referring to FIG. 2C, a preliminary contact plug 157 is formed in preliminary contact hole 155. Preliminary contact plug 157 is preferably formed of a conductive material, such as polysilicon. Preliminary contact plug 157 is typically formed by first depositing a polysilicon layer filling preliminary contact hole 155 on interlevel insulation film 151 and then performing a chemical-mechanical polishing process on the polysilicon layer. Alternatively, preliminary contact plug 157 may be formed by growing an epitaxial layer on the exposed surface of body pattern 153.

Where preliminary contact plug 157 is formed by growing the epitaxial layer, the epitaxial layer grows with the same crystalline structure as the body pattern 153. For instance, where body pattern 153 has the single crystalline silicon structure and where a silicon source gas is used to grow the epitaxial layer, preliminary contact plug 157 is formed with the single crystalline silicon structure.

Preliminary contact plug 157 is typically doped with N type or P type impurities to have N type or P type conductivity. Preliminary contact plug 157 enlarges a side area of body pattern 153 to make it easier to create a silicide layer adjacent to an interconnection contact plug 167 in an interconnection contact hole 165 in a subsequent processing step.

Figure 2D:
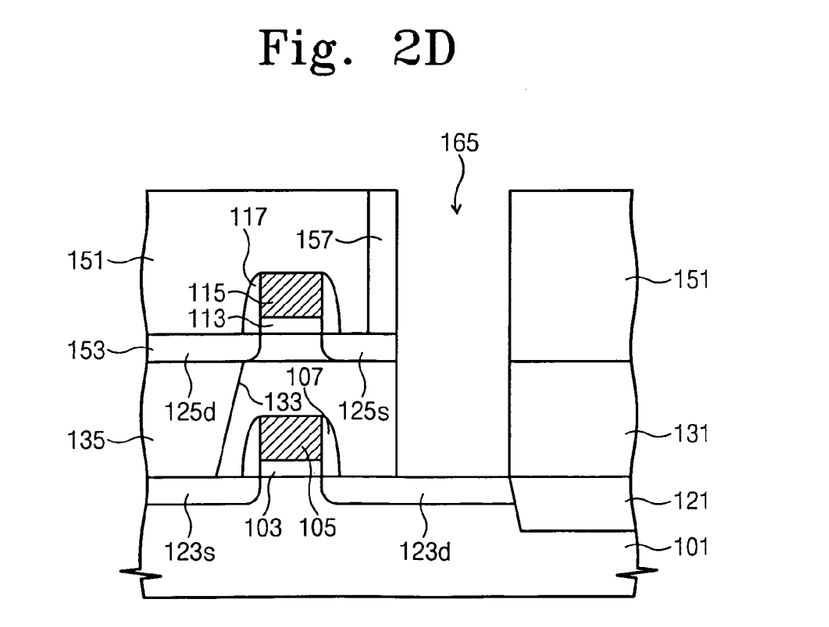

Referring to FIG. 2D, interconnection contact hole 165 is formed to partially expose lower source or drain region 123s or 123d in semiconductor substrate 101. Interconnection contact hole 165 penetrates upper interlevel insulation film 151, body pattern 153, and lower interlevel insulation film 131 and partially removes preliminary contact plug 157. Alternatively, interconnection contact hole 165 may penetrate epitaxial contact hole 133 filled with silicon epitaxial layer 135. Preferably, interconnection contact hole 165 is formed by an anisotropic etch process. The anisotropic etch process may be conducted multiple times to form more than one interconnection contact hole 165. The purpose of interconnection contact hole 165 is to connect upper source or drain region 125s or 125d with lower drain or source region 123d or 123s.

Figure 2E:
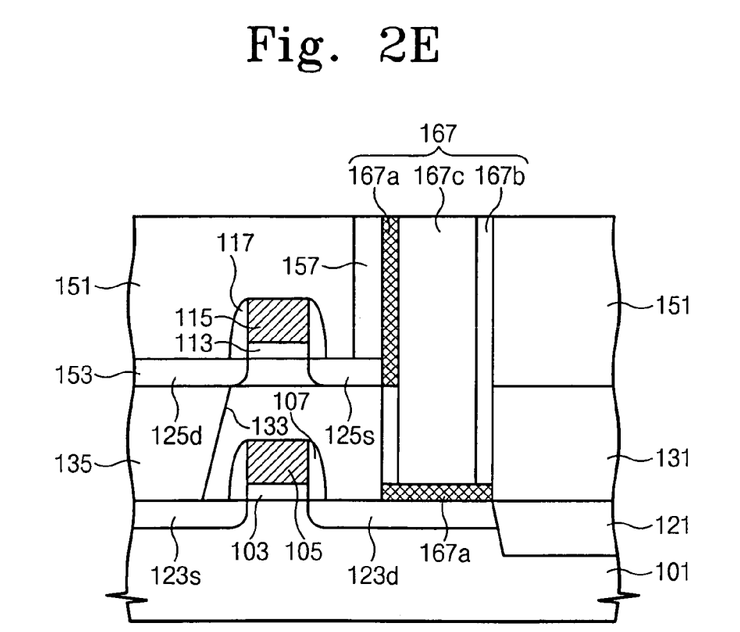

Referring to FIG. 2E, a silicide layer 167a is formed on the exposed surfaces of preliminary contact plug 157 and body pattern 153 and on an exposed surface of semiconductor substrate 101. Silicide layer 167a typically comprises a metal material such as cobalt (Co), titanium (Ti), nickel (Ni), or tantalum (Ta). Silicide layer 167a is generally formed by depositing a metal layer 167b formed of the metal material in interconnection contact hole 165 and then performing a thermal process on the metal layer to produce silicide layer 167a. Silicide layer 167a functions to reduce contact resistance between interconnection contact plug 167, which is formed after silicide layer 167a, and preliminary contact plug 157, body pattern 153, and semiconductor substrate 101. Therefore, where silicide layer 167a is correctly formed, contact resistance between the upper and lower transistors may is reduced. Metal layers 167b remain on regions where silicide layers 167a are not settled.

Interconnection contact plug 167 is completed by filling interconnection contact hole 165 with a metal plug 167c. Interconnection contact plug 167 comprises silicide layer 167a, metal layer 167b, and metal plug 167c. Metal plug 167c typically comprises copper (Cu), aluminum (Al), or tungsten (W). In addition, metal plug 167c generally includes a barrier metal film covering bottom and sidewall surfaces of metal layers previously formed in interconnection contact hole 165. The barrier metal film typically comprises titanium-nitride (TiN), tantalum-nitride (TaN), or tungsten-nitride (WN). Because a lateral face of body pattern 153 is exposed while forming interconnection contact hole 165, and silicide layer 167a extends along interconnection contact hole 165 above body pattern 153, a stable interconnection is formed between upper source or drain region 125s or 125d and lower drain or source region 123d or 123s, respectively.

Because preliminary contact plug 157 and silicide layer 167a extend a conductive surface of upper source or drain region 125s or 125d, preliminary contact plug 157 and/or silicide layer 167a may be referred to as an "extension layer."

Although FIG. 2 shows only two transistors, the method illustrated in FIG. 2 could be used to connect source and drain regions of more than two transistors.

Figure 3:
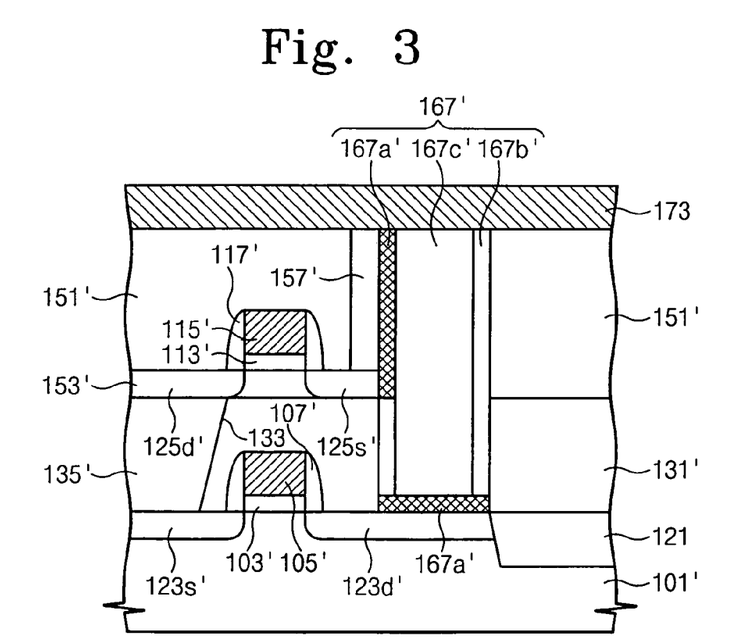
FIG. 3 is a cross-sectional diagram illustrating a stacked semiconductor device in accordance with another embodiment of the present invention.

FIG. 3 is a cross-sectional diagram of a stacked semiconductor device in accordance with another embodiment of the invention. Reference numbers shown in FIG. 3 with the prime symbol (e.g., 167') represent the same elements as corresponding reference numbers without the prime symbol in FIG. 2.

Referring to FIG. 3, a metal line 173 is formed over upper interlevel insulation film in the semiconductor device shown in FIG. 2E when upper source or drain region 125s or 125d is connected to lower drain or source region 123d or 123s. Metal line 173 may typically comprises a metal such as tungsten (W), aluminum (Al), and so on.

The device shown in FIG. 3 could be readily applied to a dynamic random access memory (DRAM). For example, the upper and lower transistors could act as cell transistors connected with each other at a node connected to metal line 173 used as a common bitline.

Figure 4A:
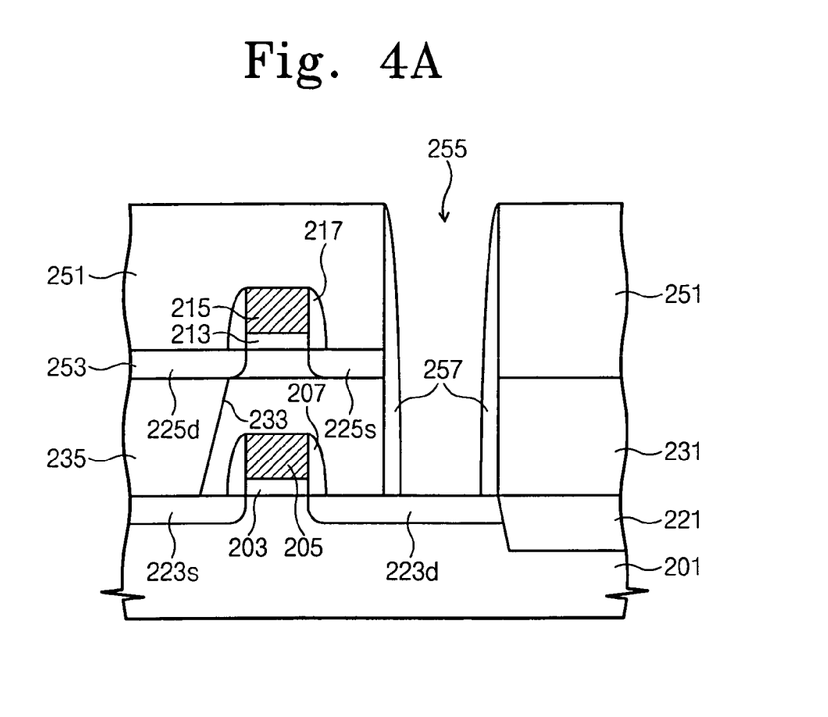
FIGS. 4A and 4B are cross-sectional diagrams illustrating a method of fabricating a stacked semiconductor device in accordance with another embodiment of the present invention.
Figure 4B:
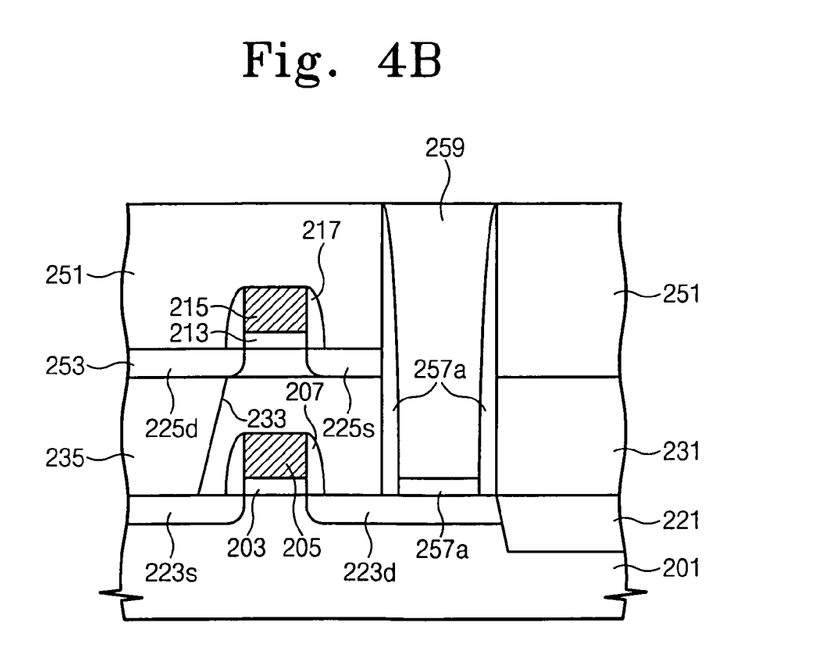

FIGS. 4A and 4B are cross-sectional diagrams illustrating a method of fabricating a stacked semiconductor device in accordance with another embodiment of the invention.

Referring to FIG. 4A, a field isolation film 221 is formed in a semiconductor substrate 201 to define active regions therein. Lower source and drain regions 223s and 223d are then formed in an active region of semiconductor substrate 201 and a lower channel region is formed between the lower source and drain regions 223s and 223d. A lower gate insulation film 203 is formed on semiconductor substrate 201 and a lower gate electrode 205 is formed on lower gate insulation film 203. Lower spacers 207 are then formed on sidewalls of lower gate electrode 205. The positions of the lower source and drain regions 223s and 223d relative to lower gate electrode 205 can be changed, i.e., reversed. Together, lower source and drain regions 223s and 223d form a lower transistor.

A lower interlevel insulation film 231 is formed on semiconductor substrate 201 over the lower transistor. A body pattern 253 is then formed on lower interlevel insulation film 231. Body pattern 253 extends over lower gate electrode 215 and it extends over lower source and drain regions 223s and 223d, either entirely or in part.

Prior to forming body pattern 253, an epitaxial contact hole 233 partially exposing the active region of semiconductor substrate 201 is formed in lower interlevel film 231. A silicon epitaxial layer 235 is grown from semiconductor substrate 201 to fill up epitaxial contact hole 233. Preferably, silicon epitaxial layer 235 has the same crystalline structure as semiconductor substrate 201. For instance, where semiconductor substrate 201 comprises a single crystalline silicon substrate, silicon epitaxial layer 235 preferably has the same structure as the single crystalline substrate.

Body pattern 253 is typically formed by first depositing an amorphous silicon layer on lower interlevel insulation film 231 and then performing a thermal process on the amorphous silicon layer to convert the amorphous silicon layer into the same crystalline structure as silicon epitaxial layer 235. Alternatively, body pattern 253 may be formed by depositing a single crystalline silicon layer or a poly crystalline silicon layer on lower interlevel insulation film 231 and then performing a patterning process on the single crystalline silicon layer or the poly crystalline silicon layer.

An upper source region 225s and an upper drain region 225d are formed in body pattern 253 and a portion of body pattern 253 between upper source and drain regions 225s and 225d acts as an upper channel region of an upper transistor. The positions of upper source and drain regions 225s and 225d may be exchanged with each other about the channel region. An upper gate insulation film 213 is formed on body pattern 253 over the channel region and an upper gate electrode 215 is formed on upper gate insulation film 213. Upper spacers 217 are formed on sidewalls of upper gate electrode 215. Collectively, upper gate electrode 215, upper source region 225s, and upper drain region 225d constitute the upper transistor.

Once the upper transistor is formed, an upper interlevel insulation film 251 is deposited on lower interlevel insulating film over the upper transistor. Preferably, upper interlevel insulation film 251 is formed of a flattened insulation material, such as that used to form lower interlevel insulation film 231.

An interconnection contact hole 255 is then formed through upper interlevel insulation film 251 and lower interlevel insulation film 231 to expose lower source or drain region 223s or 223d. A polysilicon layer is then deposited in interconnection contact hole 255 and an overall-etch (or etch-back) process is performed on the polysilicon layer to form spacers 257 on sidewalls of interconnection contact hole 255. Spacers 257 enlarge a lateral area of body pattern 253 to enable a silicide layer to be stably formed in subsequent processing steps.

Referring to FIG. 4B, a metal layer is deposited in interconnection contact hole 255 after spacers 257 are formed. The metal layer and spacers 257 are then changed into silicide layers 257a by means of a predetermined process. Silicide layers 257a typically comprise a metal material such as cobalt (Co), titanium (Ti), nickel (Ni), or tantalum (Ta). In the predetermined process, a processing time and deposition rate of metal is controlled to completely convert spacers 257 into silicide layers 257a.

The reason for converting spacers 257 into silicide layers 257a is because the electrical resistance of spacers 257 is too high to create a reliable connection between upper source drain region 225s or 225d and lower drain or source region 223d or 223s. Silicide layers 257a may be referred to as "extension layers" because they extend a conductive surface of a lateral portion of body pattern 253.

After silicide layers 257a are formed, a metal plug 259 is formed to fill interconnection contact hole 255. Metal plug 259 may be formed by filling interconnection contact hole 255 with copper (Cu), aluminum (Al), or tungsten (W). Metal plug 259 generally includes a barrier metal film covering bottom and sidewalls surfaces of interconnection contact hole 255. The barrier metal film may be formed of titanium-nitride (TiN), tantalum-nitride (TaN), or tungsten-nitride (WN). Since a lateral face of body pattern 253 is connected to silicide layers 257a and metal plug 259, a stable connection is formed between upper source or drain region 225s or 225d and lower drain or source region 223d or 223s, respectively.

According to the exemplary embodiments of the invention described above, a lateral face of a body pattern in an upper transistor is connected to a silicide layer to form a stable connection with low electrical resistance between a source or drain region of an upper transistor and a source or drain region of a lower transistor.

The foregoing preferred embodiments are teaching examples. Those of ordinary skill in the art will understand that various changes in form and details may be made to the exemplary embodiments without departing from the scope of the present invention as defined by the following claims.

What is claimed:

1. A semiconductor device, comprising:
   a lower transistor comprising first and second lower source/drain regions formed on a semiconductor substrate;
   a lower interlevel insulation film formed on the semiconductor substrate and covering the lower transistor;
   an upper transistor comprising first and second upper source/drain regions formed on the lower interlayer insulation film over the lower transistor;
   an upper interlevel insulation film formed on the lower interlevel insulation film and covering the upper transistor;
   a silicon epitaxial layer formed in an epitaxial contact hole formed in the lower interlevel insulating film to expose the first lower source/drain region;
   a contact plug comprising a first material and formed in contact with the second lower source/drain region and the second upper source/drain region; and
   an extension layer comprising a second material different from the first material and formed in contact with a lateral face of the second upper source/drain region to enlarge an area of contact between the second upper source/drain region and a side surface of the contact plug.

2. The semiconductor device of claim 1, wherein the extension layer penetrates the upper interlevel insulation film.

3. The semiconductor device of claim 1, wherein the extension layer comprises a silicide layer.

4. The semiconductor device of claim 3, wherein the extension layer further comprises a preliminary contact plug.

5. The semiconductor device of claim 1, further comprising:
   a conductive line formed on the contact plug, the conductive line acting as a bitline.

6. The semiconductor device of claim 1, wherein the contact plug further comprises a barrier metal film.

7. The semiconductor device of claim 1, wherein the upper and lower transistors form part of an inverter circuit.

8. The semiconductor device of claim 1, wherein the upper transistor comprises a positive metal-oxide semiconductor (PMOS) transistor for the inverter circuit and the lower transistor comprises a negative metal-oxide semiconductor (NMOS) transistor for the inverter circuit.

9. A semiconductor device, comprising:
   a lower transistor comprising first and second lower source/drain regions formed on a semiconductor substrate;
   a lower interlevel insulation film formed on the semiconductor substrate and covering the lower transistor;
   an upper transistor comprising first and second upper source/drain regions formed on the lower interlayer insulation film above the lower transistor;
   an upper interlevel insulation film formed on the lower interlevel insulation film and covering the upper transistor;
   a silicon epitaxial layer formed in an epitaxial contact hole formed in the lower interlevel insulating film to expose the first lower source/drain region;
   a preliminary contact plug penetrating the upper interlevel insulation film and formed in contact with the second upper source/drain region;
   a first silicide layer penetrating the upper interlevel insulation film and contacting a lateral face of the second upper source/drain region and the preliminary contact plug; and
   a contact plug penetrating the upper and lower interlevel insulation films and electrically connecting the second lower source/drain region and the second upper source/drain region.

10. The semiconductor device of claim 9, further comprising:
    a conductive line formed on the contact plug, the conductive line acting as a bit line.

11. The semiconductor device of claim 9, wherein the contact plug further comprises a barrier metal film.

12. The semiconductor device of claim 9, wherein the upper transistor comprises a positive metal-oxide semiconductor (PMOS) transistor for an inverter circuit and the lower transistor comprises a negative metal-oxide semiconductor (NMOS) transistor for the inverter circuit.

13. The semiconductor device of claim 9, wherein the combination of the preliminary contact plug, the first silicide layer and contact plug form an interconnection contact plug; and wherein the semiconductor device further comprises a metal line formed on an upper surface of the upper interlayer insulation layer in electrical contact with the interconnection contact plug.

14. The semiconductor device of claim 13, further comprising:
    a second silicide layer separating the interconnection contact plug from the second lower source/drain region.

15. A semiconductor device, comprising:
    a lower transistor comprising first and second lower source/drain regions formed on a semiconductor substrate;
    a lower interlevel insulation film formed on the semiconductor substrate and covering the lower transistor;

an upper transistor comprising first and second upper source/drain regions formed on the lower interlayer insulation film directly over the lower transistor, such that the first lower source/drain region and the first upper source/drain region are vertically aligned, and the second lower source/drain region and the second upper source/drain region are vertically aligned;

an upper interlevel insulation film formed on the lower interlevel insulation film and covering the upper transistor;

a contact plug comprising a first material and vertically connecting the second lower source/drain region with the second upper source/drain region; and an extension layer comprising a second material different from the first material and formed in contact with a lateral face of the second upper source/drain region to enlarge a contact area between the second upper source/drain region and a side surface of the contact plug.

16. The semiconductor device of claim 15, wherein the extension layer penetrates the upper interlevel insulation film.

17. The semiconductor device of claim 15, wherein the extension layer comprises a silicide layer.

18. The semiconductor device of claim 17, wherein the extension layer further comprises a preliminary contact plug.

19. The semiconductor device of claim 15, further comprising a metal bitline line formed in electrical contact with the contact plug.

20. The semiconductor device of claim 15, wherein the contact plug further comprises a barrier metal film.

21. The semiconductor device of claim 15, wherein the upper and lower transistors form a portion of an inverter circuit.

22. The semiconductor device of claim 15, wherein the upper transistor comprises a positive metal-oxide semiconductor (PMOS) transistor for the inverter circuit and the lower transistor comprises a negative metal-oxide semiconductor (NMOS) transistor for the inverter circuit.

23. The semiconductor device of claim 15, further comprising a silicon epitaxial layer formed in an epitaxial contact hole formed in the lower interlevel insulating film to expose the first lower source/drain region.

* * * * *